US012771279B2

(12) United States Patent
Yang et al.

(10) Patent No.: US 12,771,279 B2
(45) Date of Patent: Oct. 20, 2026

(54) PHOTOVOLTAIC POWER GENERATION SYSTEM FOR OPTIMALLY CONTROLLING INDIVIDUAL MODULES THAT PROVIDES AUGMENTED REALITY-BASED STATE INFORMATION

(71) Applicant: NANOOMENERGY CO., LTD., Jeju-si (KR)

(72) Inventors: Ji Hyeok Yang, Seogwipo-si (KR); Joon Woo Kim, Jeju-si (KR); Ankhzaya Baatarbileg, Jeju-si (KR)

(73) Assignee: NANOOMENERGY CO., LTD., Jeju-si (KR)

( * ) Notice: Subject to any disclaimer, the term of this patent is extended or adjusted under 35 U.S.C. 154(b) by 279 days.

(21) Appl. No.: 18/714,988

(22) PCT Filed: Aug. 31, 2022

(86) PCT No.: PCT/KR2022/013033
§ 371 (c)(1),
(2) Date: May 30, 2024

(87) PCT Pub. No.: WO2023/106564
PCT Pub. Date: Jun. 15, 2023

(65) Prior Publication Data

US 2026/0180487 A1 Jun. 25, 2026

(30) Foreign Application Priority Data

Dec. 10, 2021 (KR) ........................ 10-2021-0176830

(51) Int. Cl.
*H02S 10/00* (2014.01)
*H02S 40/30* (2014.01)
*H10F 77/00* (2025.01)

(52) U.S. Cl.
CPC .............. *H02S 10/00* (2013.01); *H02S 40/30* (2014.12); *H10F 77/935* (2025.01)

(58) Field of Classification Search
CPC ......... H02S 10/00; H02S 40/30; H10F 77/935
(Continued)

(56) References Cited

U.S. PATENT DOCUMENTS 8,452,461 B2 * 5/2013 Sawyer ..................... G06F 1/26 307/31
8,473,250 B2 * 6/2013 Adest ..................... G01D 4/004 702/182
(Continued)

FOREIGN PATENT DOCUMENTS

JP 2017153284 A 8/2017
KR 10-2010-0137324 A 12/2010
(Continued)

*Primary Examiner* — Alfonso Perez Borroto
(74) *Attorney, Agent, or Firm* — Bridgeway IP Law Group, PLLC; Jihun Kim

(57) ABSTRACT

A photovoltaic power generation system includes: a plurality of photovoltaic modules connected in series to form a serial string, wherein the serial strings are connected in parallel to make up an array; a plurality of buck converter modules including buck converters, each of which is connected to each photovoltaic module of the plurality of photovoltaic modules and steps down a voltage input from the connected photovoltaic module, and controlling power conversion operations of the buck converters to perform a maximum power point tracking for the photovoltaic modules; an inverter configured to convert a stepped down voltage output from the plurality of buck converter modules into an AC voltage; and a server configured to monitor the inputs and outputs of the plurality of buck converter modules, and determine upper and lower limits of control value of each
(Continued)

1 buck converter module to maximize total power generation of the plurality of photovoltaic modules.

11 Claims, 7 Drawing Sheets

(58) Field of Classification Search
USPC ............................................................ 307/52
See application file for complete search history.

(56) References Cited

U.S. PATENT DOCUMENTS

| | | | | |
|---|---|---|---|---|
| 8,854,193 | B2 * | 10/2014 | Makhota | G05B 9/02 340/12.27 |
| 9,018,800 | B2 | 4/2015 | Hester et al. | |
| 9,244,455 | B2 * | 1/2016 | Peterson | G05B 19/409 |
| 9,502,902 | B2 * | 11/2016 | Mumtaz | G01S 19/13 |
| 11,309,832 | B2 * | 4/2022 | Adest | H10F 77/955 |
| 2012/0175963 | A1 * | 7/2012 | Adest | H02J 1/102 307/82 |
| 2018/0351401 | A1 * | 12/2018 | Binder | H02J 13/1323 |
| 2020/0067312 | A1 * | 2/2020 | Pavlovski | H02J 3/003 |
| 2020/0403412 | A1 * | 12/2020 | Kang | H02J 3/381 |

FOREIGN PATENT DOCUMENTS

| | | | |
|---|---|---|---|
| KR | 10-1114240 | B1 | 3/2012 |
| KR | 10-1135386 | B1 | 4/2012 |
| KR | 10-1160126 | B1 | 6/2012 |
| KR | 10-2013-0041416 | A | 4/2013 |
| KR | 10-1561640 | B1 | 10/2015 |
| KR | 10-1769043 | B1 | 8/2017 |
| KR | 10-2034431 | B1 | 10/2019 |
| KR | 10-2020-0079360 | A | 7/2020 |
| KR | 10-2285990 | B1 | 8/2021 |

* cited by examiner

PHOTOVOLTAIC POWER GENERATION SYSTEM FOR OPTIMALLY CONTROLLING INDIVIDUAL MODULES THAT PROVIDES AUGMENTED REALITY-BASED STATE INFORMATION

TECHNICAL FIELD

The disclosure relates to a photovoltaic power generation system, and more particularly to a photovoltaic power generation system having a function of tracking the maximum power point under the condition that insolation is varying.

BACKGROUND ART

As the proportion of new and renewable energy is increasing globally due to problems of environmental pollution and resource depletion, demand for photovoltaic power generation using solar power as one of the new and renewable energy sources is also continuously increasing. A photovoltaic power generation system may be installed on the rooftop or roof of a building, or installed as a building-integrated photovoltaic system (BIPV).

The photovoltaic power generation system includes a plurality of photovoltaic (PV) modules, an inverter for converting direct current (DC) power into alternating current (AC) power to supply power to loads, etc. The plurality of PV modules has an array structure in which the PV modules are connected in series to constitute a string and a plurality of strings are connected in parallel.

FIG. 1 is a graph showing the output voltage-current characteristics of PV modules under various insolation conditions. As shown in FIG. 1, it will be understood that the output current and voltage are varied depending on the change in insolation, and thus the maximum power points m1, m2, m3, m4, and m5 are also varied under those insolation conditions.

In the foregoing photovoltaic power generation system, the plurality of PV modules is connected in series and parallel in the form of an array, and the output current and voltage of PV modules are continuously varied depending on insolation, shadow, etc. Accordingly, there are many difficulties in controlling a power plant to output the maximum power generation.

Although a maximum power point tracking (MPPT) algorithm has been used even in a conventional photovoltaic power generation system, the foregoing variation in the output of individual PV modules depending on the insolation and the shadow, serial, and parallel relationships between the PV modules, an MPPT operation range of the inverter, etc. are not comprehensively taken into account, and it is thus insufficient to achieve the maximum power control of the entire system.

DISCLOSURE

Technical Problem

The disclosure is conceived to solve the foregoing problems, and an aspect of the disclosure is to provide a photovoltaic power generation system that comprehensively considers variation in the output of individual PV modules, serial and parallel relationships between multiple PV modules, and a maximum power point tracking (MPPT) operation range of an inverter, thereby achieving the maximum power control of the entire system.

Technical Solution

According to an aspect of the disclosure, there is provided a photovoltaic power generation system including: a plurality of photovoltaic modules connected in series to form a serial string, wherein the serial strings are connected in parallel to make up an array; a plurality of buck converter modules including buck converters, each of which is connected to each photovoltaic module of the plurality of photovoltaic modules and steps down a voltage input from the connected photovoltaic module, and controlling power conversion operations of the buck converters to perform a maximum power point tracking (MPPT) for the photovoltaic modules; an inverter configured to convert a stepped-down voltage output from the plurality of buck converter modules into an alternating current (AC) voltage; and a server configured to monitor the inputs and outputs of the plurality of buck converter modules, and determine upper and lower limits of control value of each buck converter module to maximize total power generation of the plurality of photovoltaic modules.

Here, the server may include: a first calculator configured to calculate, based on a first photovoltaic module capable of maximum power generation among the photovoltaic modules that make up the serial string, first control values of the buck converter modules for other photovoltaic modules that belong to that serial string; a second calculator configured to calculate, based on a first serial string capable of the lowest power generation among the plurality of serial strings that make up the array, second control values of the buck converter modules for the photovoltaic modules in the serial strings other than the first serial string; a third calculator configured to calculate target control values of the buck converter modules based on the first control values and the second control values; and a control range determiner configured to determine the lower limits of the control values of the buck converter modules based on the target control values.

In this case, the first calculator may assign a maximum control value to the buck converter module for the first photovoltaic module, and calculate the first control values to be assigned as control values equal to or smaller than the maximum control value according to the current output values of the buck converter modules for other photovoltaic modules in the same serial string to which the first photovoltaic module belongs.

Further, the second calculator may assign a maximum control value to the buck converter modules for the photovoltaic modules in the first serial string, and calculate the second control values to be assigned as control values equal to or smaller than the maximum control value to the buck converter modules for the photovoltaic modules in serial strings other than the first serial string according to current output values of those serial strings.

In addition, the first calculator may calculate the first control values based on ratios of the current output power values of other photovoltaic modules in each serial string to the current output power value of the first photovoltaic module in that serial string.

Further, the second calculator may calculate the second control values based on ratios of the current output power value of the first serial string to the current output power values of other serial strings.

Meanwhile, the third calculator may calculate the target control value based on a product of the first control value and the second control value of the buck converter module.

Further, the control range determiner may determine the lower limit of the control value as a value smaller by a predetermined value than the target control value in consideration of an MPPT control value of the inverter.

Meanwhile, the upper limit of the control value of each buck converter module may be determined as a value larger by a predetermined value than the lower limit of the control value. Alternatively, the upper limit of the control value of each buck converter module may be determined as 100%.

The buck converter module may perform the power conversion operations within a range defined based on the upper and lower limits of the control value determined by the server.

Further, the server may generate and provide an augmented reality image where data about the lower limit of the control value of each buck converter module is superimposed on an image obtained by capturing the plurality of photovoltaic modules, so that a maintenance worker can identify a failed module quickly and accurately.

ADVANTAGEOUS EFFECTS

As described above, according to the disclosure, the range of the control value for performing the power conversion operations of each buck converter module is provided to efficiently perform optimal control for maximizing the total power generation of a power plant.

Further, according to the disclosure, the range of the control value for performing the power conversion operations of each buck converter module is provided through an augmented reality image, thereby having an effect on quickly and accurately identifying a photovoltaic module that requires maintenance.

BEST MODE

Hereinafter, embodiments of the disclosure will be described in detail with reference to the accompanying drawings. However, detailed descriptions of known functions or configurations, which may obscure the gist of the disclosure, are omitted from the following descriptions and the accompanying drawings. Further, it is noted that like numerals refer to like elements throughout the accompanying drawings.

Figure 1:
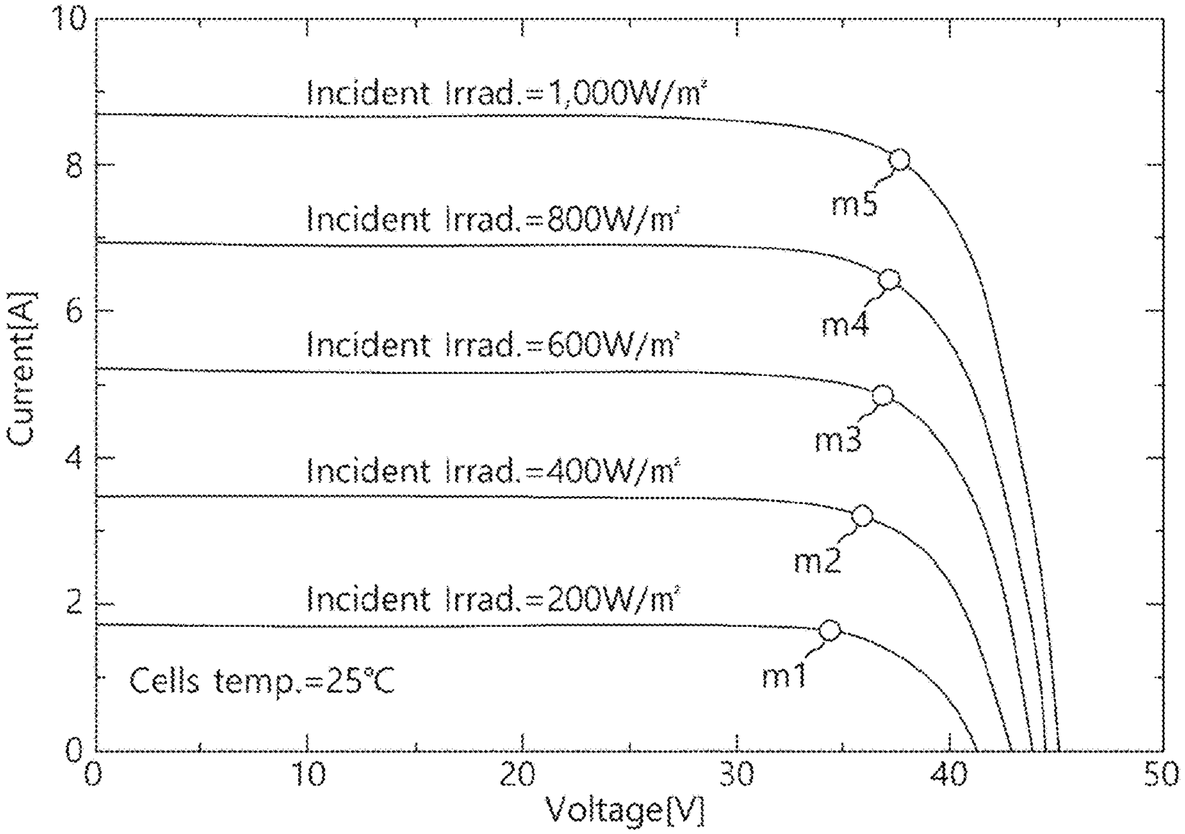
FIG. 1 is a graph showing the output voltage-current characteristics of PV modules under various insolation conditions.
Figure 2:
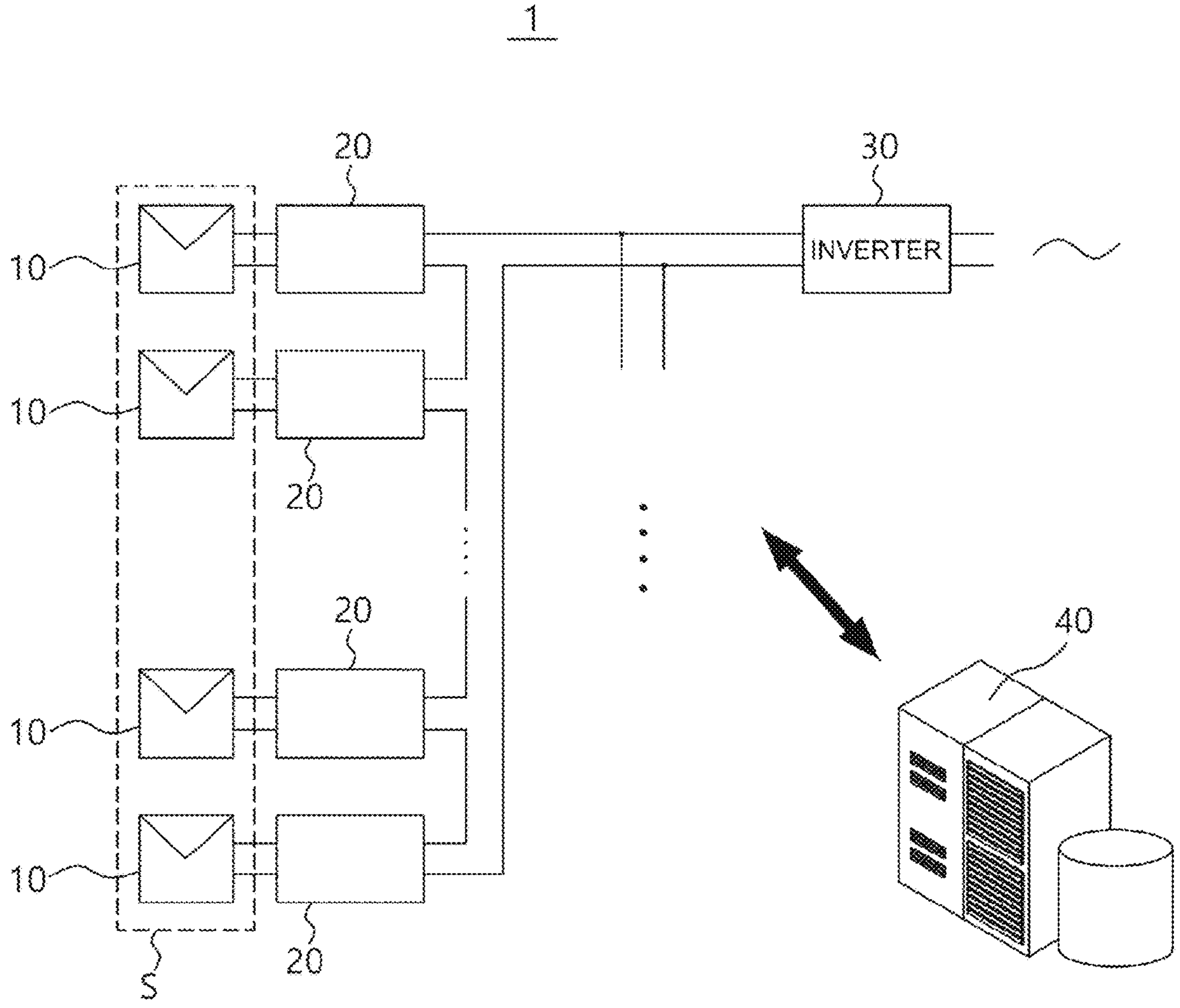
FIG. 2 is a diagram showing a schematic configuration of a photovoltaic power generation system according to an embodiment of the disclosure.

FIG. 2 is a diagram showing a schematic configuration of a photovoltaic power generation system according to an embodiment of the disclosure.

Referring to FIG. 2, a photovoltaic power generation system 1 according to an embodiment of the disclosure includes a plurality of photovoltaic modules (panels) 10, a plurality of buck converter modules 20, an inverter 30, and a server 40.

The plurality of photovoltaic modules 10 are connected in series and parallel to form an array. In other words, the plurality of photovoltaic modules 10 are connected in series to each other via the buck converter modules 20 individually connected to the respective photovoltaic modules 10 to constitute a serial string S, and the plurality of serial string S are connected in parallel, thereby forming the array.

The buck converter module 20 is connected to each photovoltaic module 10 to step down an input voltage from the photovoltaic module 10, thereby outputting the stepped-down voltage. Each buck converter module 20 includes a DC/DC buck converter. For reference, the DC/DC buck converter refers to a circuit that steps down an input voltage and outputs the stepped-down voltage, and may employ converters of various control types such as a pulse width modulation (PWM) control type and a pulse frequency modulation (PFM) control type. For example, the PWM control type converter includes a switch, a diode, an inductor, a capacitor, etc. Like this, the configurations and operations of the buck converter are well known, and thus detailed descriptions thereof will be omitted for simplicity.

Each buck converter module 20 includes a sensor (not shown) that detects an input current, an input voltage, an output current, an output voltage, etc., and a controller (not shown) that controls a power conversion operation of the buck converter based on values detected by the sensor to perform the maximum power point tracking (MPPT) for the connected photovoltaic module 10. The controller adjusts a control value for the buck converter to control the power conversion operation of the buck converter. For reference, the control value for the PWM control type converter may be a duty ratio (or duty cycle), and the control value for the PFM control type converter may be the frequency at which the converter is turned on.

Below, it will be described by way of example that the duty ratio is used as the control value for the PWM type buck converter modules 20.

Figure 3:
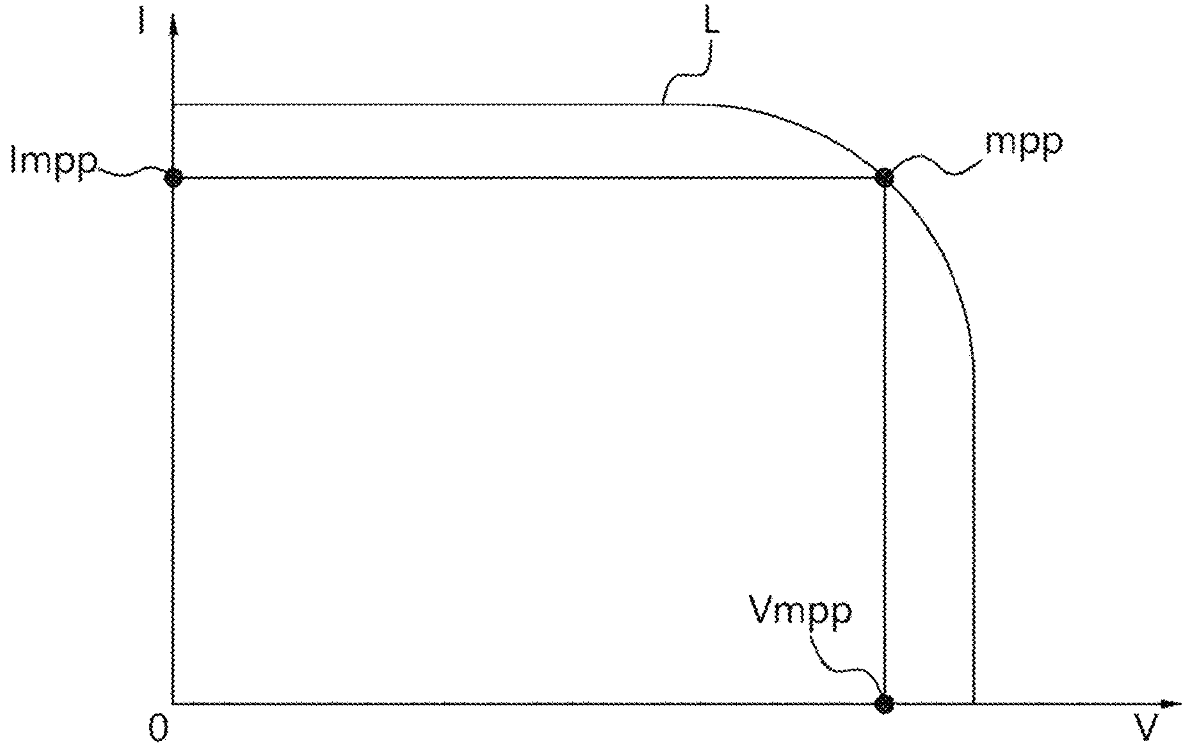
FIGS. 3 and 4 are reference diagrams for explaining a principle that a buck converter module according to an embodiment of the disclosure performs a maximum power point tracking (MPPT) operation.
Figure 4:
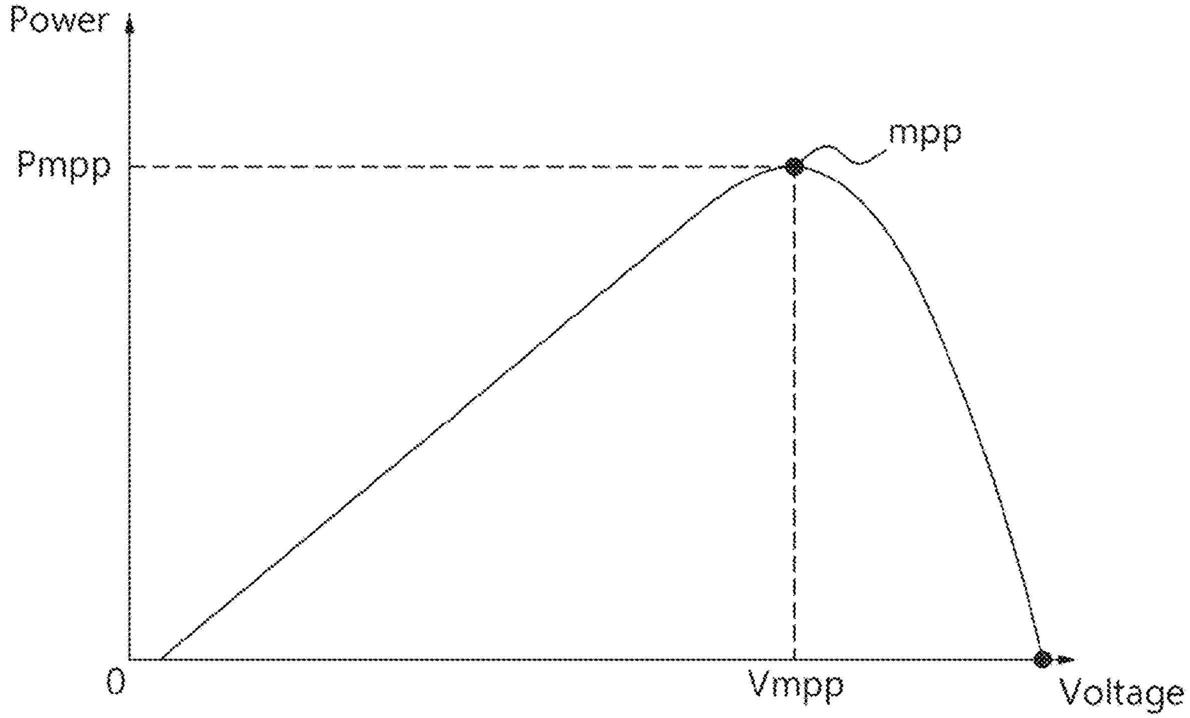

FIGS. 3 and 4 are reference diagrams for explaining a principle that the buck converter module 20 according to an embodiment of the disclosure performs an MPPT operation.

Under the conditions that the current-voltage characteristic curve of the photovoltaic module 10 is given as shown in FIG. 3 and the corresponding voltage-power curve of the photovoltaic module 10 is given as shown in FIG. 4, when an input voltage Vin is higher than the maximum power point voltage Vmpp, which is a voltage at the maximum power point mpp, the buck converter module 20 performs buck power conversion until Vin reaches Vmpp. In other words, the buck converter module 20 tracks the maximum power point mpp based on a comparison between power values before and after the conversion while performing the buck power conversion.

The inverter 30 receives a DC voltage from the plurality of buck converter modules 20 and converts the DC voltage into an AC voltage, thereby supplying the AC voltage to a load. Meanwhile, the inverter 30 performs the MPPT so as to maximize the total amount of power generated by the photovoltaic modules 10, i.e., the amount of power generated in a power plant. To maximize the total amount of power generated by the photovoltaic modules 10, the buck converter module 20 may be required to additionally perform the power conversion by considering serial and parallel connection relationships between the photovoltaic modules 10 even though each individual photovoltaic module 10 reaches its own maximum power point. Therefore, the power conversion operations of the buck converter modules 20 connected to the inverter 30 are performed based on the MPPT of the inverter 30.

Figure 5:
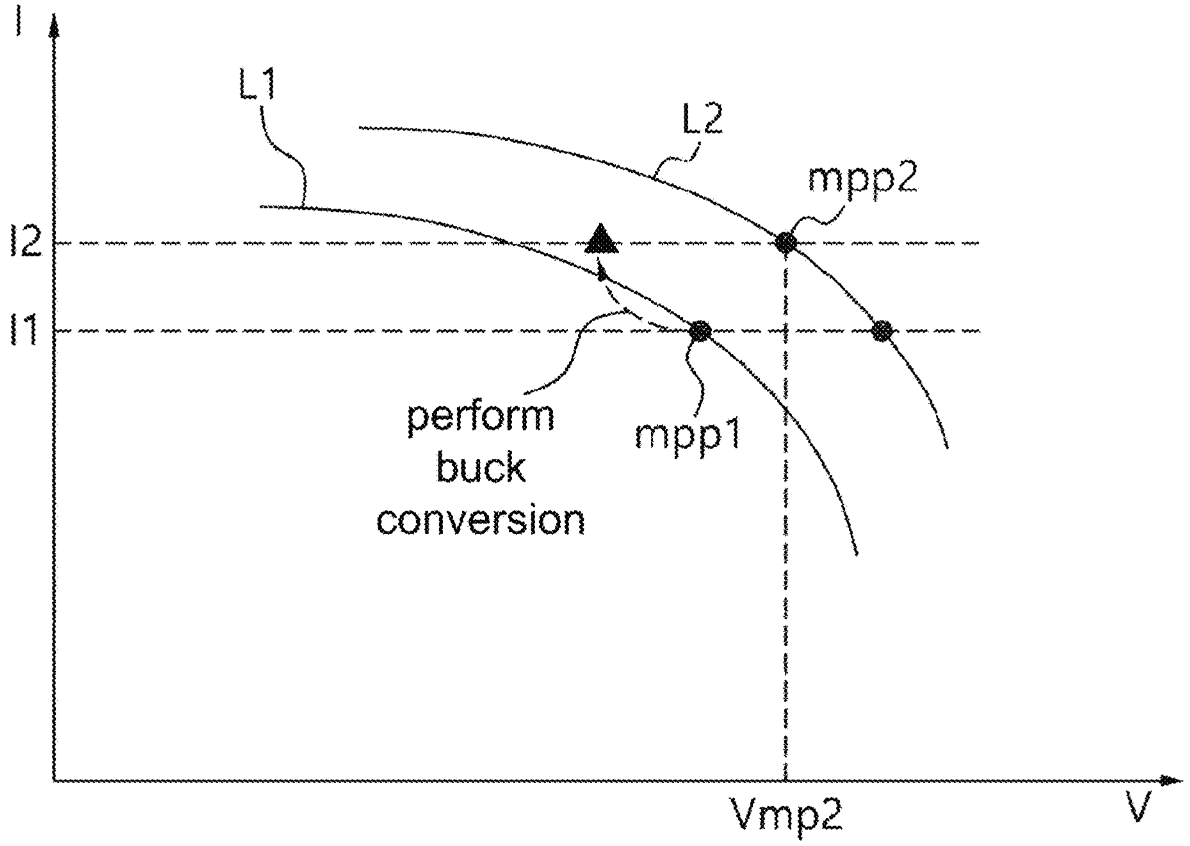
FIG. 5 is a reference diagram for explaining power conversion operations of buck converter modules based on the MPPT of an inverter according to an embodiment of the disclosure.

The parallel relationship between the serial strings S will be taken as an example. In the parallel relationship, it is required to perform the MPPT by considering the power output conditions of the serial strings S as a whole because the serial strings S connected to the inverter 30 have the same voltage level. Thus, for a certain serial string S, which is currently outputting the lowest power, i.e., the lowest current, to output higher power, it is required to control the output voltages of other serial strings S connected in parallel with the certain serial string S to be stepped down because the same voltage is applied to the parallel relationship. For example, when a serial string S1 is outputting the lowest current, the buck converter modules 20 of other serial strings S2 and S3 connected in parallel to the serial string S1 perform the power conversion to step down the input voltages to the buck converter modules 20, i.e., the output voltage from the corresponding photovoltaic modules 10, thereby enabling the serial string S1 outputting the lowest current to output higher power. For reference, even though the output voltages are stepped down as above, the output power values of the serial strings S2 and S3 are not changed because the output currents from the photovoltaic modules 10 of the serial strings S2 and S3 are increased as much as the stepped-down voltages, thereby maintaining the output power values at the maximum power points. FIG. 5 is a reference diagram for explaining power conversion operations of the buck converter modules 20 based on the MPPT of the inverter 30 according to an embodiment of the disclosure.

FIG. 5 shows current-voltage characteristic curves L1 and L2 respectively corresponding to two photovoltaic modules 10, and maximum power points mpp1 and mpp2 on the characteristic curves. In this case, it will be assumed that the two photovoltaic modules (hereinafter referred to as 'module 1' and 'module 2') belong to one serial string, and the one serial string has the same current value I1.

Referring to FIG. 5, it may be seen that the module 1 has already reached its own maximum power point mpp1, but the module 2 has not reached its own maximum power point mpp2 yet while the output current of the serial string S is I1.

In this case, to make the serial string S, to which the module 1 and the module 2 belong, output the maximum power, the buck converter module 20 for the module 1 is required to perform the buck conversion until the input voltage (=the output voltage from the module 2) to the buck converter module 20 connected to the module 2 having greater power generation potential, i.e., the buck converter module 20 for the module 2 reaches the voltage Vmp2 at the point mpp2. In other words, the buck converter module 20 for the module 1 is required to perform the buck conversion to increase the current until the current value of the corresponding serial string from the existing output current value I1 reaches 12 corresponding to the output current value at the point mpp2. For reference, even though the buck converter module 20 for the module 1 steps down the input voltage, the output power value of the module 1 remains the same as the maximum power value (i.e., the power value at mpp1) because the output current of the serial string is increased to 12.

Although a certain photovoltaic module 10 has reached its own individual maximum power point as above, the power conversion may be additionally required considering the conditions of other photovoltaic modules 10 connected to the certain photovoltaic module 10. In this way, the MPPT of the inverter 30 is performed by comprehensively taking the serial and parallel relationships of the photovoltaic modules 10 into account.

As described above, the buck converter modules 20 need to perform the MPPT autonomously as the maximum power points are continuously varied depending on variation in insolation, and at the same time, the inverter 30 also performs the MPPT. Therefore, there are difficulties in achieving optimal control for the whole photovoltaic power generation system by considering all the various factors.

For example, each individual buck converter module 20 is not informed of the conditions of other buck converter modules 20, thereby causing a problem in that the efficiency of controlling the MPPT is lowered. Referring to FIG. 5, each individual buck converter module 20 is not informed which photovoltaic module 10 is capable of the maximum power generation as well as whether the module 2 capable of the maximum power generation has reached mpp2. Therefore, there may arise a problem that the output voltage is continuously stepped down as the buck conversion is continuously performed even when the foregoing conditions are satisfied.

To solve this problem, a reference range of control values for the power conversion is provided when the buck conversion for each buck converter module 20 is performed, and power conversion operations are performed within that range of the control values, thereby significantly improving the efficiency of controlling the MPPT to increase the total output of the power plant. Thus, the server 40 monitors the input and output of the buck converter modules 20, and determines and provides the upper and lower limits of the control value for each buck converter module 20 to maximize the total amount of power generated by the plurality of photovoltaic modules 10. For example, in the case of the PWM control type converter, the server 30 determines and provides the control upper and lower limit values of a duty ratio.

In this way, the buck converter modules 20 perform the power conversion operations within the control value range defined based on the upper and lower limits of the control values determined by the server 40, thereby overcoming the foregoing control inefficiency.

Figure 6:
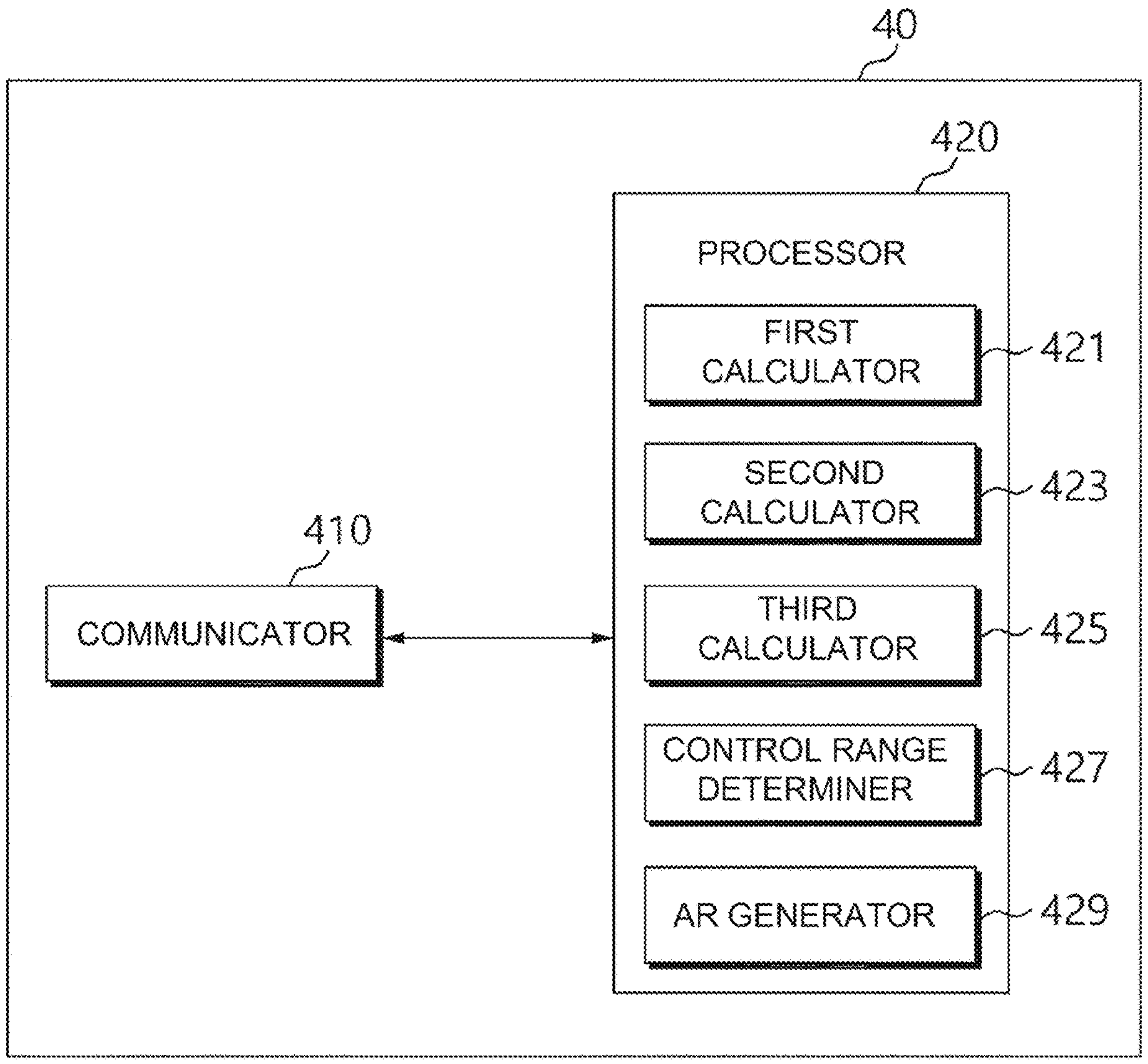
FIG. 6 is a block diagram showing the configuration of a server according to an embodiment of the disclosure.

FIG. 6 is a block diagram showing the configuration of the server 40 according to an embodiment of the disclosure. Referring to FIG. 6, the server 40 includes a communicator 410, and a processor 420, and the processor 420 includes a first calculator 421, a second calculator 423, a third calculator 425, a control range determiner 427, and an augmented reality (AR) generator 429.

The communicator 410 receives detection values of the input voltages, input currents, output currents, and output voltages of the buck converter modules 20, and transmits information about the upper and lower limits of the control values, i.e., the range of the control values calculated for each buck converter module 20. The communication may be based on various known wired and wireless communication methods, such as Wi-Fi, Ethernet, long-term evolution (LTE), and the fifth generation (5G). Further, upon transmitting and receiving data, the communicator 410 may individually communicate with the buck converter modules 20, but a separate wireless relay device may be provided for relaying communication between the plurality of buck converter modules 20 and the communicator 410.

Based on the photovoltaic module 10 capable of the maximum power generation, i.e., the maximum power generable module 10 among the photovoltaic modules 10 that make up the serial string S, the first calculator 421 calculates first control value of each buck converter module 20 for the other photovoltaic modules 10 of that serial string S. Here, the first control value refers to an intermediate value for calculating a final target control value, which is calculated from the relationship between the photovoltaic modules that make up one serial string.

In each serial string S, the maximum power-generable module may be detected based on information about the inputs and outputs, i.e., the detection values of the input voltage, input current, output current, and output voltage of the buck converter modules 20, which are received through the communicator 410. For example, relative output power values of the photovoltaic modules 10 may be compared based on the detection values of the input current and the input voltage, and it may be identified how much the output values of the buck converter modules 20 are changed as compared with the input values, thereby detecting the maximum power generable module. For example, when the duty ratio of a certain buck converter module 20 is smaller than those of other buck converter modules 20, the certain photovoltaic module 10 may be capable of relatively small power generation.

When the maximum power generable module is detected as above in each serial string, the first control value of each buck converter module 20 for other photovoltaic modules 10 that belong to the corresponding serial string are calculated based on the maximum power generable module of that serial string.

The first calculator 421 may assign the maximum control value to the buck converter module 20 for the maximum power-generable module in a certain serial string as compared with those assigned to the other buck converter modules 20 in the certain serial string, and calculate the first control values for each buck converter module 20 to be assigned as control values equal to the maximum control value or smaller than the maximum control value, which is assigned to the maximum power generable module, according to the current output power values of the buck converter module 20.

Here, the first control value to be assigned to the maximum power-generable module, i.e., the maximum control value may be a control value that is not to perform the buck conversion, e.g., 100% in the case of a duty ratio, or may be the largest control value which is practically assignable among control values smaller than 100%.

The first calculator 421 may calculate the first control values based on ratios between the current output power value of the maximum power generable module in each serial string and the current output power values of the other photovoltaic modules 10 that belong to that serial string. For reference, the current output power value of each photovoltaic module 10 may be calculated based on information collected through the communicator 410, i.e., based on the input current and input voltage of each converter module 20.

In this way, the first control values are individually assigned to each buck converter module 20 in one serial string S.

Subsequently, based on the serial string S capable of the lowest power generation, i.e., the minimum power generation string S among the plurality of serial strings S that make up an array, the second calculator 423 calculates second control values of the buck converter modules 20 for the photovoltaic modules 10 of the serial strings S other than the minimum power generation string. Here, the second control value refers to an intermediate value for calculating the final target control value, which is calculated from the relationship between the serial strings connected in parallel with each other.

Among the plurality of serial strings S that make up the array, the minimum power generation string capable of the lowest power generation may be detected based on information about the inputs and outputs of the buck converter modules 20, which are received through the communicator 410. For example, the output power values of the serial strings S may be compared by aggregating the information, i.e., the input power of the buck converter modules 20 respectively connected to the photovoltaic modules 10 in one serial string S, and the control values, e.g., the duty ratios of the buck converter modules 20 respectively connected to the photovoltaic modules 10 in one serial string S may be compared with those of the buck converter modules 20 in other serial strings S, thereby detecting the minimum power generation string capable of the lowest power generation.

Thus, when the minimum power generation string is detected among the plurality of serial strings in the array, the second control values of the buck converter modules 20 for the photovoltaic modules 10 of the serial strings S other than the minimum power generation string are calculated based on the minimum power generation string. Here, the second control value refers to a value commonly applied to the buck converter modules 20 that belongs to one serial string S.

The second calculator 423 may assign the maximum control value to the buck converter modules 20 for the photovoltaic modules in the minimum power generation string as compared with those in other serial strings, and calculate the second control values for the serial strings S so as to be assigned as control values equal to the maximum control value or smaller than the maximum control value, which is assigned to the minimum power generation string, according to the current output values of the serial strings other than the minimum power generation string. As described above, the second control value calculated for each serial string S is commonly applied to the buck converter modules 20 for all the photovoltaic modules 10 that constitute one serial string S.

Meanwhile, like the first control value, the second control value to be assigned to the minimum power generation string, i.e., the maximum control value may be a control value that is not to perform the buck conversion, e.g., 100% in the case of a duty ratio, or may be the largest control value which is practically assignable among control values smaller than 100%.

The second calculator 423 may calculate the second control values based on ratios between the current output power value of the minimum power generation string and the output power values of other serial strings S. For reference, the current output power value of the serial string S may be calculated by summing the input power of the buck converter modules 20 in one serial string S.

The third calculator 425 calculates target control value of each buck converter module 20 based on the first control value calculated by the first calculator 421 and the second control value calculated by the second calculator 423. Here, the target control value refers to a control value calculated in consideration of both relationships with other photovoltaic modules 10 included in one serial string and relationships with other serial strings connected in parallel, and is individually given to each buck converter module 20 for the photovoltaic module 10. As will be described later, the target control value is used as criteria for determining the lower limit of the control value of each buck converter module 20.

The third calculator 425 may calculate the target control value based on a product of the first control value and the second control value of each buck converter module 20.

Figure 7:
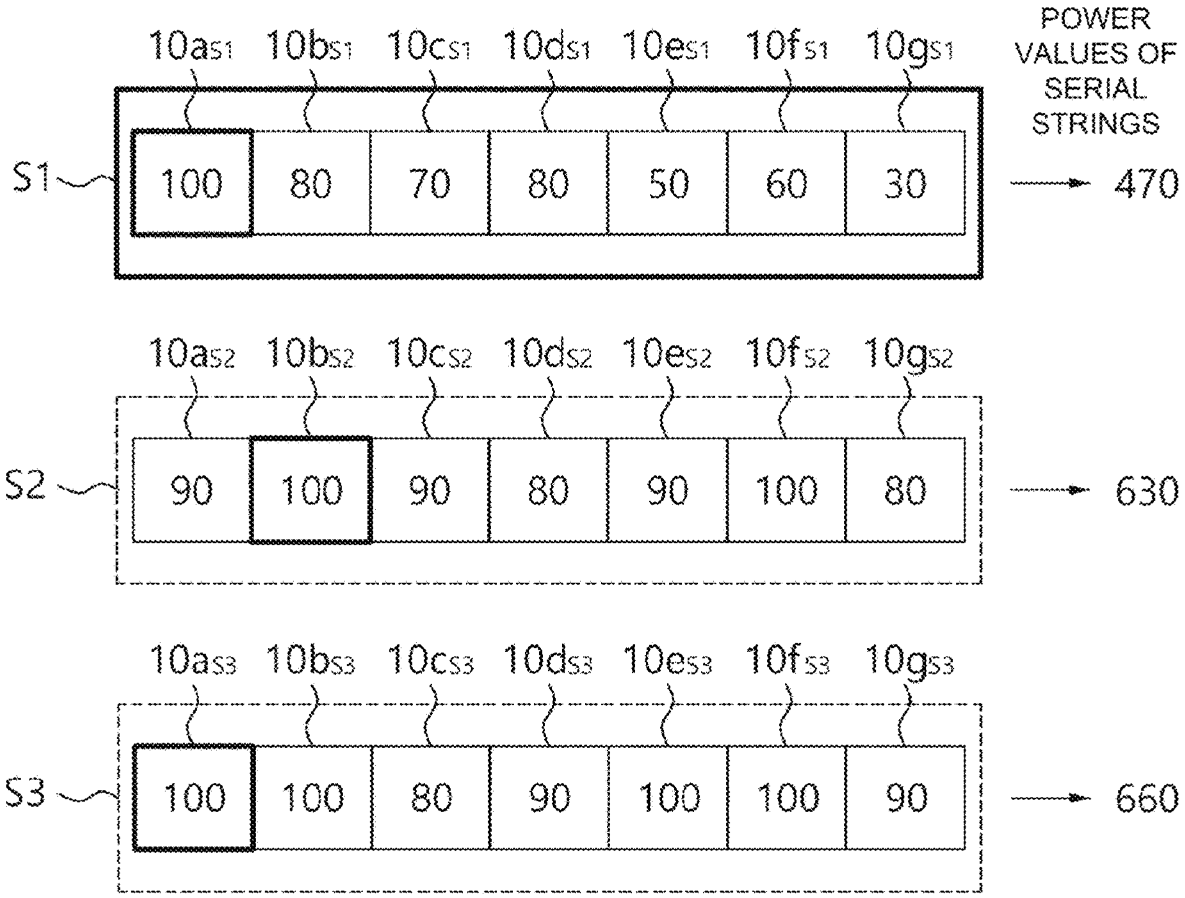
FIG. 7 is a reference diagram for explaining an example of calculating a power conversion target control value of a buck converter module according to an embodiment of the disclosure.

FIG. 7 is a reference diagram for explaining an example of calculating a power conversion target control value of the buck converter module 20 according to an embodiment of the disclosure. Referring to FIG. 7, it will be assumed that an array includes three serial strings S1, S2, and S3, and each of the serial strings S1, S2, and S3 includes seven photovoltaic modules 10$a_{s1}$ to 10$g_{s3}$. For reference, a value written on each of the photovoltaic modules 10$a_{s1}$ to 10$g_{s3}$ refers to each current output power value W of the photovoltaic modules 10$a_{s1}$ to 10$_{g3}$.

Further, it will be assumed that the maximum power-generable module in the serial string S1 is 10$a_{s1}$, the maximum power-generable module in S2 is 10$b_{s2}$, and the maximum power-generable module in S3 is 10$a_{s3}$. Meanwhile, the minimum power generation string among the three serial strings is the serial string S1 having the lowest current output power value of 470 W. First, the first control values calculated based on the relationships among the photovoltaic modules 10$a_{s1}$ to 10$g_{s3}$ included in the same serial strings are as follows. Based on the maximum power-generable modules 10$a_{s1}$, 10$b_{s2}$, and 10$a_{s3}$, the first control values of the buck converter modules 20 for other photovoltaic modules in the serial strings S1, S2, and S3 are calculated.

In other words, when the control value is given as the duty ratio, the maximum control value corresponding to the duty ratio of 100% may first be equally assigned as the first control values to all the buck converter modules 20 for the maximum power generable modules 10$a_{s1}$, 10$b_{s2}$, and 10$a_{s3}$ which are the references in the respective strings.

Meanwhile, in the case of the buck converter module 20 connected to the photovoltaic module 10$b_{s1}$, the first control value may be based on a ratio of the current output power value of that photovoltaic module 10$b_{s1}$ to the current output power value of the maximum power generable module 10$a_{s1}$ of the same serial string S1, and thus a duty ratio of 80% is calculated as the first control value.

Further, in the case of the buck converter module 20 for the photovoltaic module 10$f_{s2}$, the current output power value of that photovoltaic module 10$f_{s2}$ is 100 W, which is equal to the current output power value of the maximum power generable module 10$b_{s2}$, and thus a duty ratio of 100% may be calculated as the first control value.

In the same manner, for example, a duty ratio of 90% of the buck converter module 20 of the photovoltaic module 10$a_{s2}$, a duty ratio of 80% of the buck converter module 20 of the photovoltaic module 10$c_{s3}$, and so on may be calculated as the first control values of the buck converter modules 10$a_{s1}$ to 10$g_{s3}$.

Subsequently, the second control values calculated based on relationships among the serial strings connected in parallel to each other are as follows. Based on the minimum power generation string S1, the second control values of the buck converter modules 20 for the photovoltaic modules in other serial strings S2 and S3 are calculated.

First, the maximum control value corresponding to the duty ratio of 100% may be assigned as the second control value to the buck converter modules 20 connected to the photovoltaic modules 10$a_{s1}$ to 10$g_{s1}$ included in the minimum power generation string S1.

In addition, a ratio of the current output power value, e.g., 470 W of the photovoltaic modules included in the minimum power generation string S1 to the current output power value, e.g. 630 W of the photovoltaic modules included in the serial string S2, in other words, a duty ratio of about 74%, i.e., 470 W/630 W×100, obtained by applying the current output power value, e.g., 470 W of the photovoltaic modules included in the minimum power generation string S1 as a numerator, and applying the current output power value, e.g. 630 W of the photovoltaic modules included in the serial string S2 as a denominator may be calculated as the second control values of the buck converter modules 20 for the photovoltaic modules 10$a_{s2}$ to 10$g_{s2}$ included in the serial string S2.

In the same manner, a duty ratio of about 71%, i.e., 470 W/660 W×100 may be calculated as the second control values of the buck converter modules 20 for the photovoltaic modules 10$a_{s3}$ to 10$g_{s3}$ included in the serial string S3.

When the first control value and the second control value are calculated as above, the target control value may be calculated based on the product of the first control value and the second control value.

For example, the target control value of the buck converter module 20 connected to the photovoltaic module 10$a_{s1}$ is the product of the first control value, i.e., the duty ratio of 100%, and the second control value, i.e., the duty ratio of 100%, and thus the duty ratio of 100% may be calculated as the target control value. Meanwhile, the target control value of the buck converter module 20 for the photovoltaic module 10$b_{s1}$ included in the same serial string as that including the photovoltaic module 10$a_{s1}$ is the product of the first control value, i.e., the duty ratio of 80% and the second control value, i.e., the duty ratio of 100%, and thus the duty ratio of 80% may be calculated as the target control value.

Likewise, the duty ratio of 74% (100%×74%) may be calculated as the target control value of the buck converter module 20 for the photovoltaic module 10$b_{s2}$, the duty ratio of about 66% (90%×74%) may be calculated as the target control value of the buck converter module 20 for the photovoltaic module 10$c_{s2}$, and the duty ratio of about 57% (80%×71%) may be calculated as the target control value of the buck converter module 20 for the photovoltaic module 10$c_{s3}$.

When the target control values of the buck converter modules 20 are calculated as above, the control range determiner 427 determines the lower limit of the control value of each buck converter module 20 based on the target control value.

The control range determiner 427 may determine the lower limit of the control value as a value smaller by a predetermined value than the target control value calculated by the third calculator 425 in consideration of the MPPT control range of the inverter 30. For example, when the duty ratio of 70% is calculated as the target control value, the lower limit of the control value may be reduced by a predetermined value of 10% and determined as the duty ratio of 60%. For reference, the predetermined value may be determined by considering the control range of the inverter 30 or the like into account.

Further, the control range determiner 427 may determine the upper limit of the control value as a value larger by a predetermined value than the determined lower limit of the control value. For example, when the lower limit of the calculated control value is 50% and the predetermined value is 20%, the upper limit of the control value may be determined as a duty ratio of 70%.

Alternatively, the upper limit of the control value may be determined as the duty ratio of 100%, i.e., the maximum control value each buck converter module 20 can have. Here, the maximum control value refers to a control value that is not to perform the power conversion where the buck converter module 20 in principle steps down the voltage, and is a control value to make the output voltage of the buck converter ideally equal to the input voltage.

As above, the upper and lower limits of the control value determined by the control range determiner 427 are transmitted to each buck converter module 20 directly or via an additional communication relay device, and each buck converter module 20 performs the power conversion operation within a range defined based on the upper and lower limits of its own power conversion control value. For example, when the buck converter module 20 has a control value of which the upper limit is the duty ratio of 70% and the lower limit is the duty ratio of 30%, that buck converter module 20 performs the power conversion operation within a duty ratio range from 30% to 70%. A series of processes for calculating the upper and lower limits of the control value as described above may be repeated according to a predetermined cycle.

In this way, the server 40 sets the range of the control value of the buck converter module 20 for each photovoltaic module 10 so as to prevent the buck converter module 20 from performing unnecessary operations, thereby achieving efficient control to generate the maximum power in the whole photovoltaic power generation system.

Meanwhile, an AR generator 429 may generate and provide an augmented reality image where data including the lower limit of the control value of each buck converter module 20 is superimposed on an image obtained by capturing the plurality of photovoltaic modules 10. To this end, the server 40 matches the photovoltaic modules 10 on the captured image to the previously stored location coordinates of the photovoltaic modules 10, so that the data about the lower limits of the control values can be displayed as superimposed on the corresponding photovoltaic modules 10 of the captured image.

For reference, the technology for generating augmented reality images has been publicly known, and detailed descriptions thereof will be omitted.

Such a generated augmented reality image may be transmitted to a user terminal of a worker who is in charge of the maintenance of the photovoltaic modules 10. The maintenance worker compares the lower limit of the control value of each buck converter module 20 with the lower limits of the control values of the surrounding buck converter modules 20, thereby accurately identifying a failed photovoltaic module 10.

As described above, the photovoltaic power generation system according to the disclosure calculates and provides the upper and lower limits of the control value for performing the power conversion of each buck converter module 20, thereby efficiently performing optimal control to maximize the total power generation of a power plant.

Although it has been described above that the elements according to the embodiment of the disclosure are all combined into one or operated in combination, the disclosure is not necessarily limited to those embodiments. In other words, one or more of all the elements may be selectively combined and operated without departing from the scope of the disclosure. Further, all the elements may be individually implemented as single pieces of independent hardware, but some or all the elements may be selectively combined and implemented as a computer program with program modules to perform some or all the combined functions in one piece of hardware or a plurality of pieces of hardware. Codes and code segments making up the computer program may be easily inferred by those skilled in the art. Such a computer program is stored in computer-readable media and read and executed by a computer, thereby implementing the embodiments of the disclosure. Storage media for the computer program may include magnetic recording media, optical recording media, etc.

Further, the term "include," "comprise" or "have" as used above means that the stated elements are present, unless specifically noted to the contrary, and thus should be construed to further include other elements rather than precluding the presence thereof. Unless otherwise defined, all terms including technical or scientific terms used herein have the same meaning as generally understood by a person having ordinary knowledge in the art to which the disclosure pertains. General terms, such as terms defined in the dictionary, should be construed as consistent in the contextual meaning of the relevant art, and are not interpreted as having an idealistic or excessively formalistic meaning unless explicitly in the disclosure.

The foregoing description is merely an illustrative explanation of the technical idea of the disclosure, and a person having ordinary knowledge of the art to which the disclosure pertains can make various modifications and changes without departing from the essential characteristics of the disclosure. Therefore, the embodiments of the disclosure are not intended to limit the technical idea of the disclosure but for illustrative purposes, and the scope of the disclosure is not limited by such embodiments. The scope of the disclosure should be defined by appended claims, and all technical ideas within the equivalent scope should be construed as falling within the scope of the disclosure.

The invention claimed is:

1. A photovoltaic power generation system, comprising:

a plurality of photovoltaic modules connected in series to form a serial string, wherein a plurality of serial strings are connected in parallel to make up an array;

a plurality of buck converter modules comprising buck converters, each of which is connected to each photovoltaic module of the plurality of photovoltaic modules and steps down a voltage input from the each photovoltaic module, and controlling power conversion operations of the buck converters to perform a maximum power point tracking (MPPT) for the plurality of photovoltaic modules;

an inverter configured to convert a voltage output stepped down from the plurality of buck converter modules into an alternating current (AC) voltage; and a server configured to monitor inputs and outputs of the plurality of buck converter modules, and determine upper limit and lower limit of a control value of each buck converter module to maximize total power generation of the plurality of photovoltaic modules, wherein the server comprises:

a first calculator configured to calculate, based on a first photovoltaic module capable of maximum power generation among the plurality of photovoltaic modules that make up the serial string, first control values of the plurality of buck converter modules for other photovoltaic modules that belong to that serial string;

a second calculator configured to calculate, based on a first serial string capable of a lowest power generation among the plurality of serial strings that make up the array, second control values of the plurality of buck converter modules for the plurality of photovoltaic modules in the plurality of serial strings other than the first serial string;

a third calculator configured to calculate target control values of the plurality of buck converter modules based on the first control values and the second control values; and a control range determiner configured to determine the lower limit of the control value of each of the plurality of buck converter modules based on the target control values.

2. The photovoltaic power generation system of claim 1, wherein the first calculator assigns a maximum control value to a corresponding buck converter module for the first photovoltaic module, and calculates the first control values to be assigned as control values equal to or smaller than the maximum control value according to current output values of the plurality of buck converter modules for the other photovoltaic modules in a same serial string to which the first photovoltaic module belongs.

3. The photovoltaic power generation system of claim 1, wherein the second calculator assigns a maximum control value to the plurality of buck converter modules for the plurality of photovoltaic modules in the first serial string, and calculates the second control values to be assigned as control values equal to or smaller than the maximum control value to the plurality of buck converter modules for the plurality of photovoltaic modules in the plurality of serial strings other than the first serial string according to current output values of those serial strings.

4. The photovoltaic power generation system of claim 1, wherein the first calculator calculates the first control values based on ratios of current output power values of the other photovoltaic modules in each serial string to a current output power value of the first photovoltaic module in that serial string.

5. The photovoltaic power generation system of claim 1, wherein the second calculator calculates the second control values based on ratios of a current output power value of the first serial string to current output power values of other serial strings.

6. The photovoltaic power generation system of claim 1, wherein the third calculator calculates each of the target control values based on a product of each of the first control values and each of the second control values of each of the plurality of buck converter modules.

7. The photovoltaic power generation system of claim 1, wherein the control range determiner determines the lower limit of the control value as a value smaller by a predetermined value than the target control value in consideration of an MPPT control value of the inverter.

8. The photovoltaic power generation system of claim 1, wherein the upper limit of the control value of each buck converter module is determined as a value larger by a predetermined value than the lower limit of the control value.

9. The photovoltaic power generation system of claim 1, wherein the upper limit of the control value of each buck converter module is determined as 100%.

10. The photovoltaic power generation system of claim 1, wherein the plurality of buck converter modules perform the power conversion operations within a range defined based on the upper limit and the lower limit of the control value determined by the server.

11. The photovoltaic power generation system of claim 1, wherein the server generates an augmented reality image where data about the lower limit of the control value of each buck converter module is superimposed on an image obtained by capturing the plurality of photovoltaic modules.

* * * * *